United States Patent
Yamazaki

(10) Patent No.: US 9,196,869 B2
(45) Date of Patent: Nov. 24, 2015

(54) MANUFACTURING METHOD OF LIGHT-EMITTING DEVICE WITH NANO-IMPRINTING WIRING

(71) Applicant: Semiconductor Energy Laboratory Co., Ltd., Kanagawa-ken (JP)

(72) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 26 days.

(21) Appl. No.: 13/796,703

(22) Filed: Mar. 12, 2013

(65) Prior Publication Data

US 2013/0240852 A1    Sep. 19, 2013

(30) Foreign Application Priority Data

Mar. 16, 2012    (JP) ................ 2012-060106

(51) Int. Cl.
*H01L 51/52* (2006.01)
*H01L 51/00* (2006.01)

(52) U.S. Cl.
CPC ........ *H01L 51/5271* (2013.01); *H01L 51/5212* (2013.01); *H01L 51/5228* (2013.01); *H01L 51/0022* (2013.01); *H01L 51/5209* (2013.01); *H01L 51/5225* (2013.01); *H01L 51/5275* (2013.01)

(58) Field of Classification Search
CPC ............ H01L 51/0022; H01L 51/5225; H01L 51/5271; H01L 51/5209
See application file for complete search history.

(56) References Cited

U.S. PATENT DOCUMENTS

| | | | |
|---|---|---|---|
| 7,754,520 B2 | 7/2010 | Lee | |
| 8,928,018 B2 | 1/2015 | Ikeda et al. | |
| 2005/0142379 A1* | 6/2005 | Juni et al. | 428/690 |
| 2007/0120136 A1* | 5/2007 | Noda et al. | 257/98 |
| 2007/0205418 A1 | 9/2007 | Takahashi | |

FOREIGN PATENT DOCUMENTS

JP    2009-130132    6/2009

\* cited by examiner

*Primary Examiner* — Thanh V Pham
(74) *Attorney, Agent, or Firm* — Husch Blackwell LLP

(57) ABSTRACT

Provided is a light-emitting device in which a voltage drop is suppressed and light extraction efficiency is increased. Provided is a light-emitting device with increased productivity. Provided is a light-emitting device with high reliability. An extremely thin conductive film from 3 nm to 50 nm is used as an electrode on a light-emitting side and an auxiliary wiring is provided in contact with the electrode. When the width of the auxiliary wiring is 100 μm or less, the auxiliary wiring is hardly perceived with the naked eye, so that a light-emitting device in which light extraction efficiency is increased and luminance is obtained uniformly. The extremely thin auxiliary wiring can be formed by nanoimprinting technology. With use of nanoimprinting technology, the width of the auxiliary wiring can be reduced to 10 nm or less.

20 Claims, 8 Drawing Sheets

MANUFACTURING METHOD OF LIGHT-EMITTING DEVICE WITH NANO-IMPRINTING WIRING

BACKGROUND OF THE INVENTION

1. Field of the Invention

The present invention relates to a light-emitting device including an organic EL element.

2. Description of the Related Art

Research and development of organic EL (ElectroLuminescent) elements have been extensively conducted. The fundamental structure of the organic EL element is that a layer containing a light-emitting organic compound is sandwiched between a pair of electrodes. By applying voltage to this element, light emission from the light-emitting organic compound can be obtained.

Organic EL elements can be formed in the form of a film and thus can easily constitute large-area elements, and also have great potential as planar light sources applicable to lighting and the like.

For example, a lighting device including an organic EL element is disclosed in Patent Document 1.

In addition, as for an organic EL element, there are a top-emission type in which light is extracted from the side of a substrate, on which an organic EL element is formed; a bottom-emission type in which light is extracted from the side of the substrate, which is opposite to the side on which the organic EL element is formed; and a dual-emission type in which light is extracted from both the sides.

A conductive material having light-transmitting properties to light emitted from a light-emitting organic compound is used for an electrode on a light-emitting side in an organic EL element. For example, an oxide conductor such as an indium tin oxide or an indium zinc oxide is often used.

REFERENCE

Patent Document

[Patent Document 1] Japanese Published Patent Application No. 2009-130132

SUMMARY OF THE INVENTION

A conductive material used for an electrode on the light-emitting side in an organic EL element (hereinafter also referred to as light-emitting element) preferably has high light-transmitting properties. As the light-transmitting properties of a conductive material which is used are high, the light extraction efficiency is improved; thus, a highly efficient light-emitting element can be provided.

In addition, the conductive material is desired to have low resistance. Particularly when the light-emitting device is employed for a lighting device, voltage drop resulting from electrode resistance becomes marked as a light-emitting area is increased. If the voltage drop becomes marked, there is a problem that luminance cannot be obtained uniformly in the light-emitting region.

However, there is also a problem that an oxide conductor often used as a light-transmitting conductive material has relatively high resistivity.

Thus, in order to reduce the resistance, the oxide conductor needs to be a thick oxide film (e.g., an indium tin oxide of about several hundreds nanometers). An oxide film can be formed typically by a sputtering method; however, it is difficult to increase the deposition rate and thus when a thick oxide film is formed, productivity cannot be increased. Further, dust (including a small foreign substance referred to as a particle) might attach to the formation surface in a long-time deposition process; thus, reliability of the light-emitting element might be impaired.

The present invention is made in view of the foregoing technical background. Accordingly, it is an object of one embodiment of the present invention is provided a light-emitting device in which voltage drop is suppressed and the light extraction efficiency is increased. It is another object to provide a light-emitting device with increased productivity. It is another object to provide a light-emitting device with high reliability.

One embodiment of the present invention solves at least one of the above problems.

In order to solve the problems, the structure of an electrode on the light-emitting side is focused. An extremely thin conductive film is used as the electrode on the light-emitting side and an auxiliary wiring is provided in contact with the electrode.

Thus, a light-emitting device according to one embodiment of the present invention includes a first electrode layer over an insulating surface, a second electrode layer over and overlapping with the first electrode layer, a layer containing a light-emitting organic compound between the first electrode layer and the second electrode layer, and a first auxiliary wiring on and in contact with the upper surface of the second electrode layer. Further, the first electrode layer has reflective properties with respect to light emitted from the layer containing a light-emitting organic compound. The second electrode layer has light-transmitting properties with respect to the light emission and a thickness from 3 nm to 50 nm.

With such a structure, a light-transmitting electrode on the light-emitting side can be formed extremely thin and absorption of the light emitted from the layer containing a light-emitting organic compound by the electrode can be suppressed; thus, high light extraction efficiency can be achieved. Further, time for depositing the conductive film used as the electrode can be shorter; thus, the productivity and reliability of a light-emitting device with such a structure can be increased. Furthermore, an auxiliary wiring (first auxiliary wiring) on and in contact with the light-transmitting electrode can suppress voltage drop even if an extremely thin electrode is used; thus, luminance can be obtained uniformly.

In the above light-emitting device, the first auxiliary wiring is preferably formed to have a thinnest width of from 10 nm to 100 μm, when seen from a direction perpendicular to the insulating surface.

In the above light-emitting device, the first auxiliary wiring is preferably formed to have a thinnest width of from 10 nm to 1 μm, when seen from the direction perpendicular to the insulating surface.

Light emitted from the light-emitting element is shielded in a region where the auxiliary wiring in contact with the light-transmitting electrode is provided, and thus the region where the auxiliary wiring is provided is a no-light-emitting region. However, the width of the auxiliary wiring is 100 μm or less, so that the no-light-emitting region is hardly perceived with the naked eye and luminance can be obtained uniformly. When the light-emitting device is used as a lighting device, for example, favorable planar light-emission can be obtained without a light diffusion sheet or the like.

Further, when the width of the auxiliary wiring is 1 μm or less, light with a wavelength in the visible light region is diffracted at large angles, so that the no-light-emitting region formed by the auxiliary wiring is not practically perceivable.

Such a wiring with an exceedingly thin width can be formed by using a nanoimprinting technique. The use of a nanoimprinting technique can reduce the width of the auxiliary wiring to 10 nm or less.

In the above light-emitting device, the second electrode layer preferably contains a layer formed of a metal or an alloy.

With such a structure, resistance of the light-transmitting electrode can be lowered, which is preferable. In addition, the electrode can be extremely thin; thus, absorption of light emitted from the layer containing a light-emitting organic compound can be suppressed and the light extraction efficiency can be increased.

An indium-containing oxide conductor has relatively low resistance; however, indium is a rare metal and thus is expensive. In some cases, in order to lower the resistance of the conductive film formed of the indium-containing oxide conductor, the conductive film is formed in an atmosphere containing water, thereby containing hydrogen carriers. However, by this method, deterioration of the light-emitting element might be stimulated by water in the film. For this reason, the use of a metal or an alloy instead of such an oxide conductor is particularly effective.

The electrode on the light-emitting side preferably contains a silver-containing conductive material. The resistivity of silver is extremely low and is less expensive than indium which is a rare metal; thus, productivity can be increased. It is particularly preferable to use a conductive material containing an alloy of silver and magnesium because both of high conductivity and high carrier injecting properties can be achieved.

In the above light-emitting device, the first auxiliary wiring is preferably arrayed in a two-dimensional pattern when seen from the direction perpendicular to the insulating surface, and the shape surrounded by the auxiliary wiring is preferably circular or polygonal.

The auxiliary wiring in contact with the light-transmitting electrode is provided in a lattice pattern; thus, luminance can be obtained more uniformly. Such a lattice-patterned electrode cannot be formed by a method with a metal mask. In addition, a conventional photolithography method is not practical because a light-emitting element is exposed in an etching process and a resist separation process. When a printing method such as a nanoimprinting method is used, an auxiliary wiring with such a shape can be formed with high reliability.

In the above light-emitting device, the upper surface of the first electrode layer preferably has projections and depressions in a region overlapping with the first auxiliary wiring when seen from the direction perpendicular to the insulating surface.

With such a structure, light reflected on the back surface of the auxiliary wiring in contact with the light-transmitting electrode is further reflected diffusely by the projections and depressions of the reflective electrode and is then emitted to the outside through the region where the auxiliary wiring is not provided. Thus, light emitted from the light-emitting element can be almost thoroughly extracted.

In addition, the following structure is preferable for the above light-emitting device: over the insulating surface, a second auxiliary wiring is provided to overlap with the first auxiliary wiring, when seen from the direction perpendicular to the insulating surface, the first electrode layer is provided to cover and be in contact with the upper surface of the second auxiliary wiring; and the upper surface of the first electrode layer has projections and depressions reflecting the shape of the second auxiliary wiring.

Like this structure, it is preferable to form projections and depressions on the electrode surface by providing the auxiliary wiring (the second auxiliary wiring) in contact with the reflective electrode below the electrode. Thus, as described above, the light extraction efficiency can be improved by the projections and depressions, and at the same time, voltage drop in the reflective electrode can be suppressed.

The above light-emitting device preferably includes a first substrate containing a metal or an alloy and the first electrode layer on the insulating surface formed on the first substrate.

When a material having high thermal conductivity is used for a substrate over which a light-emitting element is formed, heat generated by the light-emitting element can be efficiently dissipated to the outside, and thus a reliable light-emitting device can be provided.

In addition, the light-emitting device preferably includes a second substrate having light-transmitting properties with respect to light emitted from the layer containing a light-emitting organic compound and facing the second electrode layer, and a sealing layer between the second electrode layer and the second substrate.

Sealing with the sealing layer can increase mechanical strength of the light-emitting device compared to a sealed hollow structure. Further, light emitted from the light-emitting element is emitted to the second substrate side through the sealing layer; thus, the light extraction efficiency can be improved compared to a sealed hollow structure.

In the light-emitting device, one of two opposed surfaces of the second substrate, which does not face the second electrode layer, is preferably provided with a lens array at least in a region overlapping with the layer containing a light-emitting organic compound when seen from the direction perpendicular to the insulating surface.

When the lens array is provided on the surface of the substrate on the light-emitting side, which is in contact with the outside, total reflection can be suppressed at an interface between the substrate on the light-emitting side and the outside; thus, the light extraction efficiency can be improved. Further, the width of the auxiliary wiring of the electrode on the light-emitting side can be extremely thin; thus, if a region where light is blocked by the auxiliary wiring becomes highlighted by the lens array, the light-blocked region is hardly perceived.

In the above light-emitting device, the refractive index of the second substrate is preferably higher than the refractive index of the sealing layer, and the refractive index of the lens array is preferably higher than the refractive index of the sealing layer.

Such a structure can suppress total reflection at an interface between the sealing layer and the second substrate and an interface between the second substrate and the lens array, whereby extremely high light extraction efficiency can be realized.

A method for manufacturing a light-emitting device of one embodiment of the present invention includes a step of forming a first electrode layer over an insulating surface, a step of forming and stacking a layer containing a light-emitting organic compound and a second electrode layer in this order over the first electrode layer, and a step of forming a first auxiliary wiring on and in contact with the second electrode layer by a nanoimprinting method. Further, the first electrode layer has reflective properties with respect to light emitted from the layer containing a light-emitting organic compound. The second electrode layer has light-transmitting properties with respect to the light emission and a thickness from 3 nm to 50 nm.

Another method for manufacturing a light-emitting device of one embodiment of the present invention includes a step of forming a second auxiliary wiring on an insulating surface, a step of forming a first electrode layer covering the upper surface of the second auxiliary wiring, a step of forming and stacking a layer containing a light-emitting organic compound and a second electrode layer in this order over the first electrode layer, and a step of forming a first auxiliary wiring by a nanoimprinting method over the second electrode layer. The first electrode layer has reflective properties with respect to light emitted from the layer containing a light-emitting organic compound and has projections and depressions on the upper surface of the first electrode layer, reflecting the shape of the second auxiliary wiring. The second electrode layer has light-transmitting properties with respect to the light emission and a thickness from 3 nm to 50 nm. The first auxiliary wiring is formed to overlap with the second auxiliary wiring when seen from a direction perpendicular to the insulating surface.

By using a nanoimprinting method, the auxiliary wiring whose width is extremely thin can be provided, over the light-emitting element. By using a nanoimprinting method, the manufacturing process is simplified, and thus the light-emitting device can be manufactured with high productivity.

In the case where the auxiliary wiring (the second auxiliary wiring) which is in contact with the reflective electrode is provided, the auxiliary wiring is not necessarily reduced in width and may be thus formed by a method other than a nanoimprinting method.

The term an EL layer in this specification means a layer provided between a pair of electrodes of a light-emitting element, and specifically means at least a layer containing a light-emitting organic compound (also referred to as a light-emitting layer), or a stack including the light-emitting layer.

Note that a light-emitting device in this specification refers to an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

According to the present invention, a light-emitting device in which voltage drop is suppressed and the light extraction efficiency is increased can be provided. Further, a light-emitting device with increased productivity can be provided. Furthermore, a reliable light-emitting device can be provided.

DETAILED DESCRIPTION OF THE INVENTION

Figure 1A:
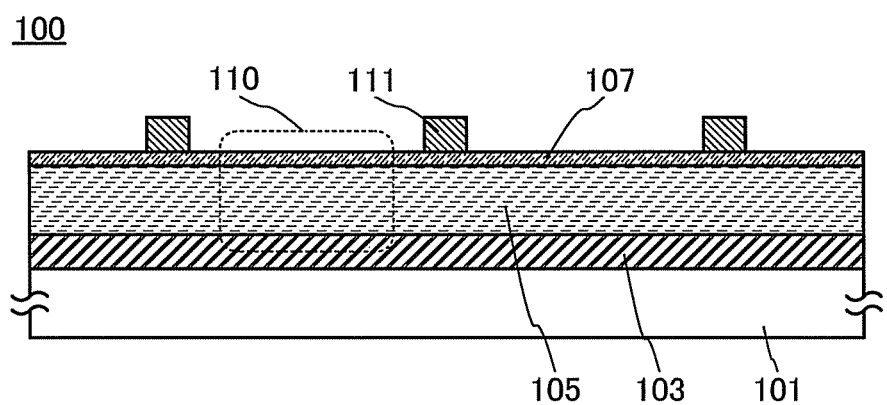
FIGS. 1A and 1B illustrate a light-emitting device according to one embodiment of the present invention.

Embodiments are described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

(Embodiment 1)

In this embodiment, a structure example of a light-emitting device according to one embodiment of the present invention and an example of a manufacturing method thereof will be described with reference to drawings.

<Structure Example>

A schematic cross-section of a light-emitting device 100 which is one embodiment of the present invention is illustrated in FIG. 1A.

The light-emitting device 100 includes a light-emitting element 110 in which a first electrode layer 103, an EL layer 105, and a second electrode layer 107 are stacked in this order over a first substrate 101 having an insulating surface. Further, an auxiliary wiring 111 is provided on and in contact with the second electrode layer 107.

The first electrode layer 103 has reflective properties with respect to light emitted from the EL layer 105. The second electrode layer 107 has light-transmitting properties with respect to the light. Thus, the light-emitting element 110 is a top-emission type light-emitting element which emits light from the first substrate 101 side where the light-emitting element 110 is formed (such a surface is also referred to as formation surface).

As the material of the substrate provided on a light-emitting side, a light-transmitting material such as glass, quartz, or an organic resin can be used. The material of the substrate provided on the opposite side of the light-emission side does not necessarily transmit light; a material such as a metal, a semiconductor, ceramics, and a colored organic resin can be used other than the above materials. In the case of using a conductive substrate, an insulating surface is formed at least on the formation surface, by oxidizing the formation surface or forming an insulating film thereon.

As a method by which a surface of a conductive substrate such as a metal substrate or an alloy substrate is insulated, an anodic oxidation method, an electrodeposition method, or the like can be used. For example, in the case where an aluminum substrate is used as the substrate, owing to the high insulating property of an aluminum oxide formed on a surface by an anodic oxidation method, the aluminum oxide can be formed thin, which is preferable. In addition, when an electrodeposition method is used, an organic resin such as a polyamide-imide resin, or an epoxy resin can be formed on the substrate surface. Such an organic resin is preferable because it has high insulating properties and flexibility and thus a crack hardly occurs in the surface even when the substrate is bent. In addition, when a high heat-resistant material is used, deformation of the substrate surface due to heat generated at the time of driving the light-emitting device can be suppressed.

In the case where an organic resin is used for the substrates, for example, any of the following can be used as the organic resin: polyester resin such as polyethylene terephthalate (PET) and polyethylene naphthalate (PEN); a polyacrylonitrile resin; a polyimide resin; a polymethylmethacrylate resin; a polycarbonate (PC) resin; a polyethersulfone (PES) resin; a polyamide resin; a cycloolefin resin; a polystyrene resin; a polyamide imide resin; a polyvinylchloride resin; and the like. Further, a substrate in which glass fiber is impregnated with an organic resin or a substrate in which inorganic filler is mixed with an organic resin can also be used.

Especially in the case of a top-emission light-emitting device, a substrate having high thermal conductivity such as a metal substrate or an alloy substrate is preferably used as the substrate on the side opposite to the light-emitting side. A large lighting device using a light-emitting element might have a problem of heat generation from the light-emitting element, and the use of such a substrate having high thermal conductivity can enhance heat dissipation. For example, use of stainless steel, an aluminum oxide, duralumin, or the like for a substrate can enhance heat dissipation and achieve weight reduction. A stacked structure of aluminum and an aluminum oxide, a stacked structure of duralumin and an aluminum oxide, a stacked structure of duralumin and a magnesium oxide, or the like is preferably used because the substrate surface can have an insulating property.

When a flexible material is used for the substrate of the light-emitting device, a flexible light-emitting device can be provided. The substrate can be a base material whose formation surface is curved three-dimensionally, for example.

The second electrode layer 107 provided on the light-emission side is extremely thin (from 3 nm to 50 nm, preferably from 3 nm to 30 nm). It is preferable that a metal or an alloy material is used for the second electrode layer 107 because its conductivity is increased. Since the second electrode layer 107 is extremely thin, even when a metal or an alloy is used, the absorption of light emitted from the EL layer 105 can be prevented; thus, high light extraction efficiency can be obtained.

In addition, the auxiliary wiring 111 provided in contact with the second electrode layer 107 suppresses voltage drop even if the second electrode layer 107 is formed extremely thin; thus, the luminance of the light-emitting device 100 can be obtained uniformly.

As a material used for the second electrode layer 107, a metal material such as gold, silver, platinum, magnesium, nickel, tungsten, chromium, molybdenum, iron, cobalt, copper, palladium, and titanium; or an alloy material containing any of these metal materials can be used. Further, nitrides of these metal materials (e.g., titanium nitride) or the like may be used. A material containing silver is preferably used for the second electrode layer 107.

A light-transmitting conductive oxide may be used for the second electrode layer 107. For example, indium oxide, indium tin oxide, indium zinc oxide, zinc oxide, zinc oxide to which gallium is added, or the like is preferably used to improve the light-transmitting properties. Even when such materials having comparatively high resistance are used, the auxiliary wiring 111 can suppress voltage drop. Further, these oxide materials can be deposited thin enough, and thus the light-emitting device 100 can be manufactured without decreasing productivity.

The second electrode layer 107 can be a single layer or a stacked layer using one or more of the above-described material.

A single graphene film or a multiple film (2 to 100 layers) may be stacked over the second electrode layer 107. Graphene has both high conductivity and high light-transmitting properties and thus supports the conductivity of the second electrode layer 107 without sacrificing the light extraction efficiency. Graphene can be provided between the second electrode layer 107 and the auxiliary wiring 111 or provided to cover the second electrode layer 107 and the auxiliary wiring 111.

The EL layer 105 includes at least a layer containing a light-emitting organic compound. In addition, the EL layer 105 can have a stacked structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

Note that in one embodiment of the present invention, a light-emitting element (a tandem light-emitting element) in which a plurality of light-emitting layers is provided between the first electrode layer 103 and the second electrode layer 107 can be used. A two-layered, three-layered, or four-layered structure is preferably used (in particular, three-layered). In addition, an intermediate layer containing a substance having a high electron-transport property, a substance having a high hole-transport property, or the like can be included between these EL layers.

A structure of the light-emitting element is described in detail in Embodiment 4.

The first electrode layer 103 provided on the side opposite to the light-emission side is formed using a reflective material. As the reflective material, a metal material such as aluminum, gold, platinum, silver, nickel, tungsten, chromium, molybdenum, iron, cobalt, copper, or palladium can be used. An alloy material containing the metal material can be used. For example, any of the following alloys can be used: aluminum-containing alloys (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on an aluminum alloy film, whereby preventing oxidation of the aluminum alloy film. As examples of a material for the metal film or the metal oxide film, titanium, titanium oxide, and the like are given. Aluminum can be used for the material of the electrode layer; however, in that case, the electrode layer might be corroded when the wiring is provided to be in direct contact with conductive oxide such as indium tin oxide. Therefore, it is preferable that the electrode layer have a stacked-layer structure and that aluminum be used for a layer which is not in contact with conductive oxide.

The auxiliary wiring 111 is provided on and in contact with the second electrode layer 107. A high-conductive metal or alloy material is used for the auxiliary wiring 111. As the metal or the alloy material for the auxiliary wiring 111, the exemplified materials of the first electrode layer 103 or the second electrode layer 107 can be used.

The auxiliary wiring 111 is preferably formed thin to have a thinnest width of from 10 nm to 100 µm, preferably from 10 nm to 1 µm when seen from a direction perpendicular to the insulating surface.

The width of the auxiliary wiring 111 is 100 µm or less; thus, the auxiliary wiring 111 is hardly perceivable with the naked eye and luminance can be obtained uniformly. For example, when the light-emitting device 100 is used as a lighting device, favorable planar light-emission can be obtained without a light diffusion sheet or the like.

Further, when the width of the auxiliary wiring 111 is 1 µm or less, light with a wavelength in the visible light region is diffracted at large angles, so that a light-blocked region (no-light-emitting region) formed by the auxiliary wiring 111 is not practically perceivable.

Such a wiring with an exceedingly thin width can be formed by using a nanoimprinting technique described below. The use of a nanoimprinting technique can reduce the width of the auxiliary wiring to less than 10 nm.

The auxiliary wiring 111 is preferably periodically patterned when seen from the direction perpendicular to the insulating surface. For example, a grid pattern, a stripe pattern, a dot pattern, a pattern in which rectangles are arranged periodically, or the like can be given. When the auxiliary wiring 111 is formed to have periodical arrangement, luminance of the light-emitting device 100 can be obtained uniformly.

It is preferable that the auxiliary wiring 111 is two-dimensionally patterned in a grid form and openings surrounded by the auxiliary wiring 111 are circle figures (including oval figures) or polygonal shapes. Light emitted from the light-emitting element 110 is emitted through the openings; thus, when the openings have the same shape, luminance can be obtained uniformly.

Figure 1B:
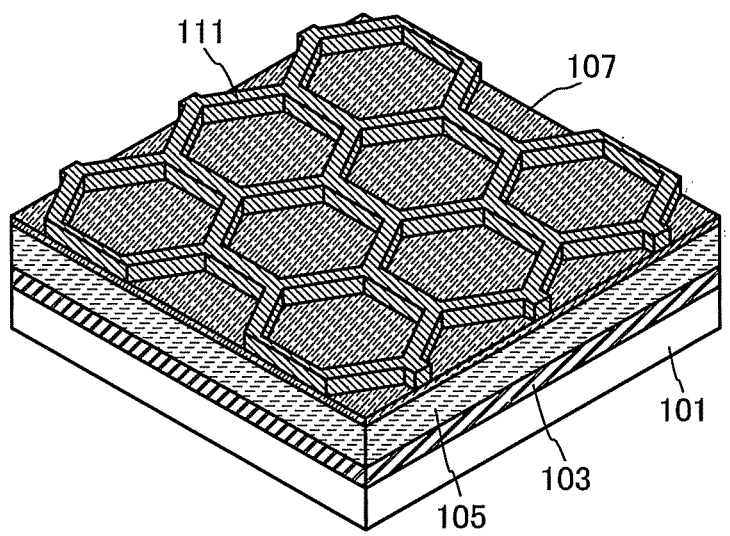

FIG. 1B is a schematic perspective view of the light-emitting device 100 in the case where the shape of openings surrounded by the auxiliary wiring 111 is a hexagon (also referred to as a honeycomb shape). Such a honeycomb shape is particularly preferable because it has six-fold symmetry centering on each opening and thus is a highly symmetric figure; therefore, angular dependency of luminance can be suppressed.

Figure 2A:
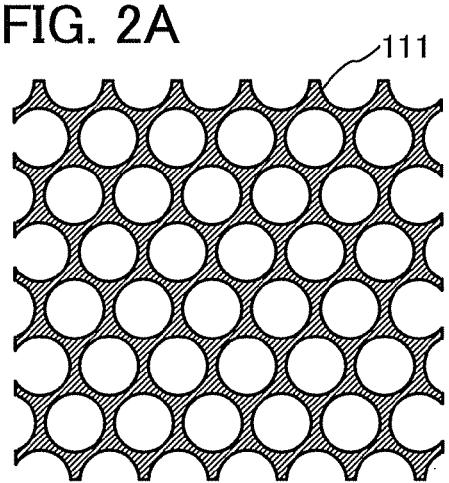
FIGS. 2A to 2C each illustrate a light-emitting device according to one embodiment of the present invention.
Figure 2B:
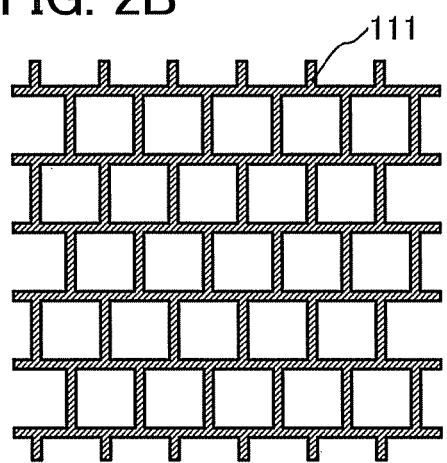
Figure 2C:
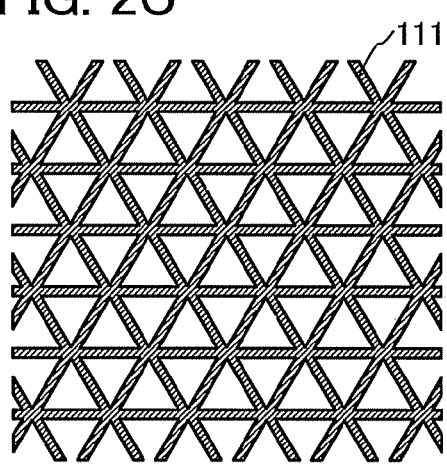

The auxiliary wiring 111 can have various shapes other than the honeycomb shape. FIGS. 2A to 2C are schematic top views showing other examples of the shape of auxiliary wiring 111.

FIG. 2A is an example in which the shape of openings surrounded by the auxiliary wiring 111 in FIG. 1B is changed from a hexagon to a circle. Being highly symmetrical like the shape in FIG. 1B, angular dependency of luminance can be suppressed. When part of the auxiliary wiring 111 surrounded by three openings is thick, conductivity can be improved. The shape of openings may be oval.

FIG. 2B is an example in which rectangular openings are arranged in rows and successive rows are staggered by half cycle (i.e., a staggered brick pattern). When the auxiliary wiring 111 are arrayed in this manner, fringes can be more reduced than the case of a simple grid pattern with straight lines intersecting at right angles. Note that although the openings are square in FIG. 2B, the auxiliary wiring 111 may be arrayed to form rectangles.

FIG. 2C is an example in which triangle openings are arranged to be closest-packed structure. When the auxiliary wiring 111 is closely packed with openings surrounded with three sides, voltage drop in the second electrode layer 107 can be effectively suppressed.

The above is the description of the structure example of the light-emitting device described in this embodiment.

<Example of Manufacturing Method>

Figure 3A:
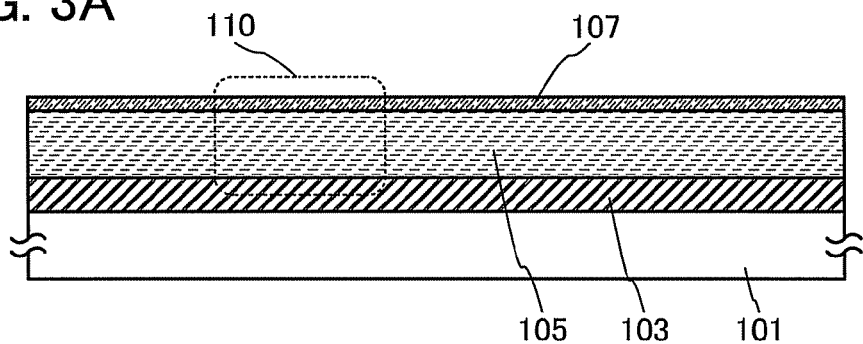
FIGS. 3A to 3C illustrate a method for manufacturing a light-emitting device according to one embodiment of the present invention.
Figure 3B:
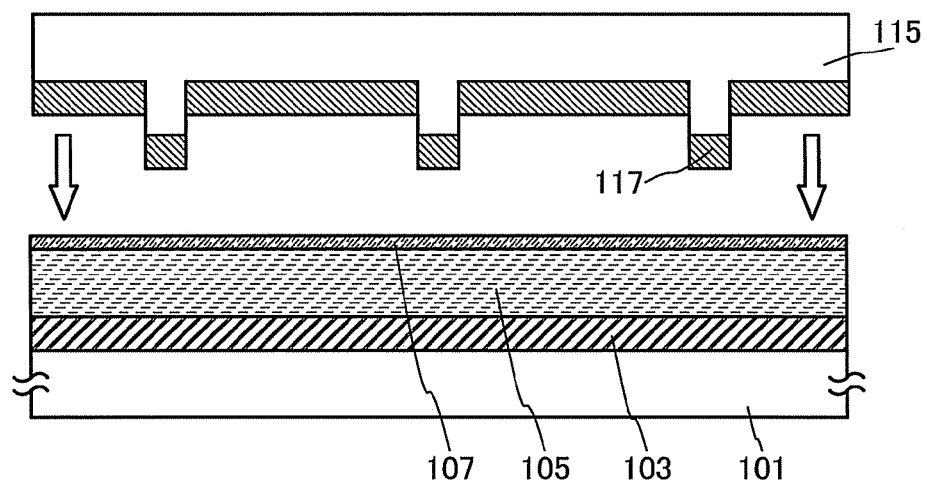
Figure 3C:
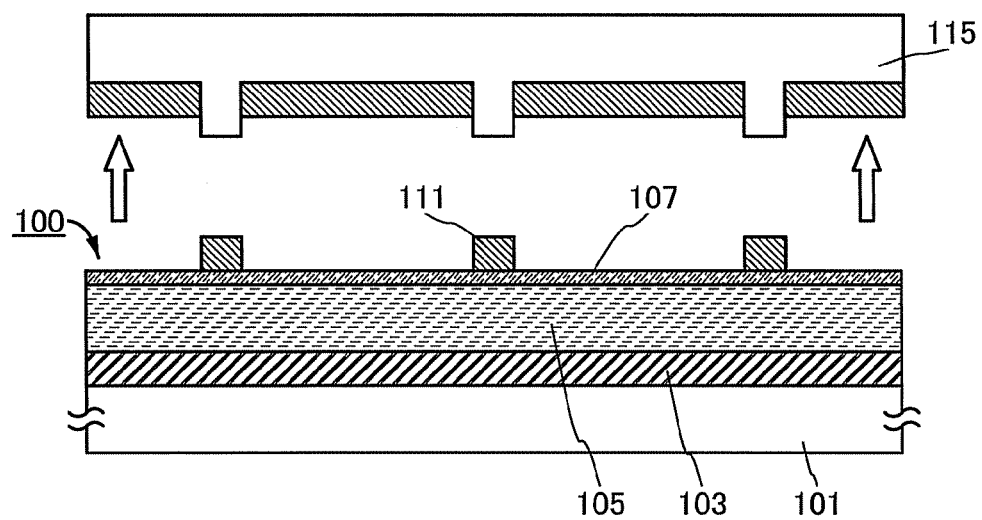

An example of a manufacturing method of the above-described light-emitting device 100 is described below. FIGS. 3A to 3C are schematic cross-sectional views for explaining the example of manufacturing steps.

First, the first electrode layer 103, the EL layer 105, and the second electrode layer 107 are stacked in this order on the insulating surface of the first substrate 101, thereby forming the light-emitting element 110 (FIG. 3A).

The first electrode layer 103 is formed using the above-described materials by a sputtering method or an evaporation method.

The EL layer 105 is formed by an evaporation method, a droplet discharge method, a coating method, or the like.

The second electrode layer 107 is formed using the above-described materials by a sputtering method or an evaporation method. In the case of using a conductive film containing silver or a silver-containing alloy (preferably an alloy of silver and magnesium), for example, the second electrode layer 107 can be formed by an evaporation method. Damage to the EL layer 105 in deposition can be reduced by using an evaporation method as compared to a sputtering method, thereby forming a reliable light-emitting element 110.

Next, the auxiliary wiring 111 is formed on and in contact with the second electrode layer 107 by a nanoimprinting method.

For forming the auxiliary wiring 111, a direct nanoimprinting method such as a nano-transfer printing method (also called metal-transfer printing method) and a cathode-transfer printing method can be used.

The auxiliary wiring 111 is formed as follows: a mold 115 with projections each of which is provided with a transfer film 117 on the surface of the mold 115 is pressed against the upper surface of the second electrode layer 107 (FIG. 3B); the transfer film 117 and the second electrode layer 107 are bonded to each other; and then the mold 115 is separated from the transfer film 117, so that the transfer film 117 is transferred to the second electrode layer 107 (FIG. 3C). The transfer film 117 transferred here becomes the auxiliary wiring 111.

When the mold 115 is pressed to the second electrode layer 107, the transfer film 117 and the second electrode layer 107 may be bonded while they are heated for tight bonding. In this case, the heating temperature is preferably 150° C. or lower in consideration of heat damage on the light-emitting element 110.

As the mold 115, a hard substrate material such as a metal substrate, a semiconductor substrate, a glass substrate, and a quartz substrate can be used. By using such a hard substrate material, the auxiliary wiring 111 can be patterned with high accuracy.

Alternatively, an elastomer such as a silicon-based elastomer, a nitrile-based elastomer, an acrylic-based elastomer, or polybutadiene can be used as the mold 115. Polydimethylsiloxane (PDMS) is particularly preferable. By using such an elastomer, pressure applied in the transfer can be extremely suppressed compared to the case of using a hard material (e.g., the pressure is one-hundredth to one-thousandth of the pressure in the case of using a hard material). Accordingly, damage on the light-emitting element 110 can be reduced and thus the light-emitting element 110 can have high reliability.

By using the mold 115 including an elastomer, if a substrate whose formation surface is curved is used as the first substrate 101, the auxiliary wiring 111 can be easily formed.

Alternatively, the above-described hard substrate material and the above-described elastomer can be used for the base material of the mold 115 and the projections, respectively. By using an elastomer for the projections pressed to the second electrode layer 107, when the mold 115 is pressed thereto, pressure applied to the light-emitting element 110 can be reduced, which is preferable.

Further alternatively, an elastomer and a hard substrate material can be used for the base material of the mold 115 and the projections, respectively. In this case, a synthetic resin, a metal, an oxide, or the like can be given as the material used for the projections. By using an elastomer for the base material of the mold 115, even if the second electrode layer 107 has a curved upper surface, the auxiliary wiring 111 can be easily formed along the curved surface.

The transfer film 117 eventually becomes the auxiliary wiring 111; thus, the above-described materials which can be used for the auxiliary wiring 111 can be used for the transfer film 117. For depositing the transfer film 117 on the mold 115, an evaporation method, a sputtering method, a coating method, or the like can be used. An evaporation method is particularly preferable.

Nanocrystals of the above-described material or solution (ink) containing the nanocrystals can be used for the transfer film 117. In the case of using ink, ink is applied on the surface of the mold 115 and then the solvent is removed in advance. Alternatively, after ink is transferred to the second electrode layer 107, the solvent is removed by being heated at a temperature of 150° C. or lower, thereby forming the auxiliary wiring 111.

In addition, a separation layer may be provided between the mold 115 and the transfer film 117 so that the transfer film 117 is easily separated. For the separation layer, a material whose strength of bonding to the transfer film 117 is weaker than the bonding strength between the transfer film 117 and the second electrode layer 107 can be used. Various materials can be used for the separation layer, for example, an oxide or a nitride such as a silicon oxide, a silicon nitride, and a titanium nitride, and an organic resin such as a fluorine resin.

The separation layer might remain in contact with the auxiliary wiring 111 which is transferred. The separation layer in contact with the auxiliary wiring 111 also serves as a protection film for the auxiliary wiring 111, which suppresses insulation due to oxidation of the surface of the auxiliary wiring 111, and high conductivity can be maintained.

A bond layer may be provided on the surface of the transfer film 117 provided on the mold 115 in order to increase adhesiveness between the second electrode layer 107 and the transfer film 117. In this case, a conductive material is used for the bond layer. When the material contained in a conductive film used as the second electrode layer 107 is used for the bond layer, the strength of bonding to the second electrode layer 107 can be increased, which is preferable.

Through the above-described process, the light-emitting device 100 can be manufactured.

This embodiment can be combined with any of the other embodiments disclosed in this specification as appropriate.
(Embodiment 2)

In this embodiment, a structure example of a light-emitting device which is different from the structure in the above embodiment is described with reference to drawings. Note that description of, the same portions as those in the above embodiment is skipped or simplified below.
<Structure Example>

Figure 4A:
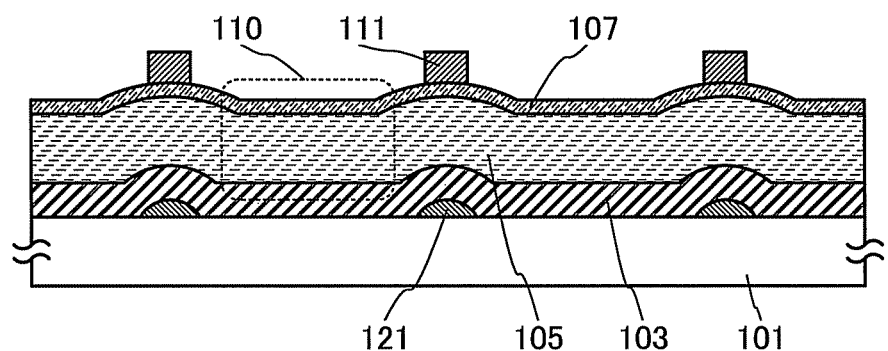
FIGS. 4A and 4B illustrate a light-emitting device according to one embodiment of the present invention.

FIG. 4A is a schematic cross-sectional view of a light-emitting device 120 exemplified in this structure example.

The light-emitting device 120 is different from the light-emitting device 100 in the above embodiment in that an auxiliary wiring 121 (also referred to as second auxiliary wiring) overlapping with the auxiliary wiring 111, when seen from the direction perpendicular to the insulating surface of the first substrate 101, is provided between the first electrode layer 103 and the first substrate 101.

The conductive material similar to that used for the auxiliary wiring 111 can be used for the auxiliary wiring 121.

The first electrode layer 103 is provided to cover the auxiliary wiring 121 and thus the upper surface thereof (the surface in contact with the EL layer 105) has an unevenness formed by the shape of the auxiliary wiring 121.

It is preferable that the auxiliary wiring 121 have a shape in which the step formed by the auxiliary wiring 121 does not break the first electrode layer 103.

For example, when the auxiliary wiring 121 is sufficiently thin with respect to the first electrode layer 103, the first electrode layer 103 can be formed without break. The thickness of the auxiliary wiring 121 is 100% or less (preferably 80% or less) of the thickness of the first electrode layer 103.

In addition, as shown in FIG. 4A, end portions of the auxiliary wiring 121 are preferably tapered. In the case where the end portions of the auxiliary wiring 121 are tapered, the first electrode layer 103 can be formed without break even if the auxiliary wiring 121 is thick. The thicker the auxiliary wiring 121 is, the larger the roughness of the upper surface of the first electrode layer 103 can be.

The auxiliary wiring 121 can be formed by a photolithography method, a printing method such as a screen printing method, a discharging method such as an ink-jet method and a dispensing method, a plating method, or the like.

The auxiliary wiring 121 is preferably formed by a nanoimprinting method. Particularly when the auxiliary wiring 111 is thin, the auxiliary wiring 121 which is formed thin by a nanoimprinting method is preferably used.

When the auxiliary wiring 121 is formed by a nanoimprinting method, various methods such as a thermal nanoimprinting method, an optical nanoimprinting method, a micro-contact printing method, a micro-transfer molding method, a nano-transfer printing method (also called a metal-transfer printing method), and a cathode-transfer printing method can be used.

Among these methods, in the case of using a method in which a resist is processed (e.g., a thermal nanoimprinting method and an optical nanoimprinting method), the auxiliary wiring 121 can be formed as follows: a conductive film and a resist are stacked over an insulating surface, the resist is processed to have unevenness by a nanoimprinting method, films left in the depressions of the resist are etched to expose the conductive film, and then, the conductive film is etched using the resist as a mask.

Such an auxiliary wiring 121 is provided below the first electrode layer 103, so that the projections reflecting the shape of the auxiliary wiring 121 is formed on the upper surface of a region of the first electrode layer 103 overlapping with the auxiliary wiring 111 when seen from the direction perpendicular to the insulating surface of the first substrate 101.

Next, the reason why the light extraction efficiency is improved by the projections and depressions on the upper surface of the first electrode layer 103 is described with reference to FIG. 4B.

Light from the EL layer 105 is emitted in various directions. Light emitted from the EL layer 105 to the first electrode layer 103 side is reflected by the first electrode layer 103 and extracted to the outside through the second electrode layer 107. Part of the light emitted from the EL layer 105 to the second electrode layer 107 side is reflected by the back surface of the auxiliary wiring 111; however, most of the light is reflected by the first electrode layer 103 and extracted through the second electrode layer 107.

However, when the upper surface of the first electrode layer 103 is flat, light emitted from the EL layer 105 under the auxiliary wiring 111 and reflected by the auxiliary wiring 111 is not extracted to the outside. This is because reflection is repeated between the auxiliary wiring 111 and the first electrode layer 103.

Figure 4B:
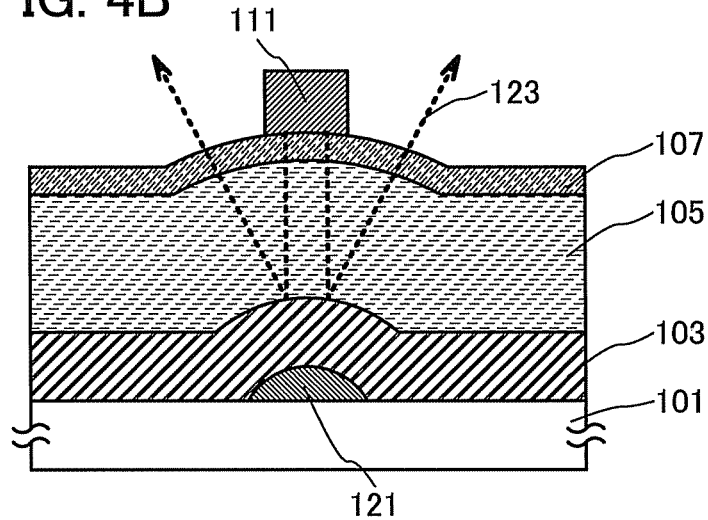

Here, when the upper surface in the region of the first electrode layer 103 overlapping with the auxiliary wiring 111 is projected as shown in FIG. 4B, light 123 reflected by the auxiliary wiring 111 is diffusely reflected by the projected surface. Thus, the light can be extracted to the outside through the second electrode layer 107 in the region where the auxiliary wiring 111 is not provided. As a result, the light emitted from the light-emitting element 110 can be almost thoroughly extracted to the outside.

In order to improve the light extraction efficiency, the upper surface of the first electrode layer 103 in the region overlapping with the auxiliary wiring 111 is projected, and an insulating layer having projections may be formed instead of the auxiliary wiring 121. However, the light extraction efficiency can be further improved and voltage drop in the first electrode layer 103 can also be suppressed when the auxiliary wiring 121 is formed.

In addition, with use of a reflective conductive material, preferably the same material as the first electrode layer 103, the auxiliary wiring 121 may be formed on and in contact with the upper surface of the first electrode layer 103. In this case, the end portion of the auxiliary wiring 121 is preferably tapered to improve coverage with the EL layer 105 which is formed covering the auxiliary wiring 121.

As described above, the light-emitting device 120 includes the first electrode layer 103 with projections and depressions in the region overlapping with the auxiliary wiring 111; thus, a light-emitting device in which voltage drop in the first electrode layer 103 and the second electrode layer 107 is suppressed and light extraction efficiency is increased can be provided.

<Modification Example>

A light-emitting device whose structure is different from the above structure example is described below.

Figure 5:
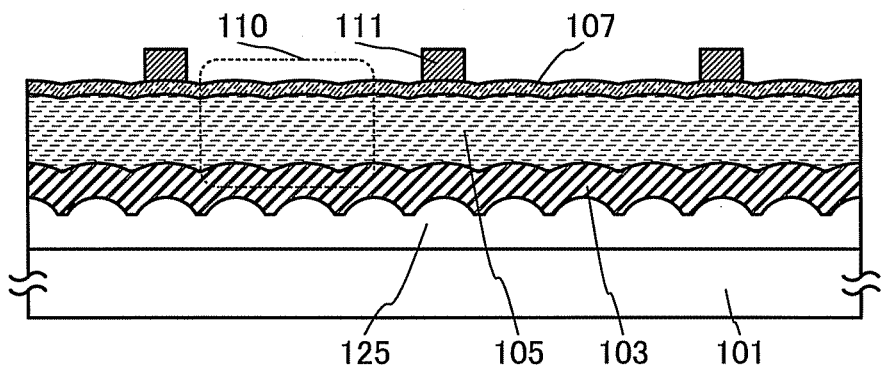
FIG. 5 illustrates a light-emitting device according to one embodiment of the present invention.

FIG. 5 is a schematic cross-sectional view of a light-emitting device 140 described in this modification example. A difference between the light-emitting device 140 and the light-emitting device 120 is in that the light-emitting device 140 includes an insulating layer 125 with projections and depressions instead of the auxiliary wiring 121.

The upper surface of the insulating layer 125 which is in contact with the first electrode layer 103 has projections and depressions. The upper surface of the first electrode layer 103 has projections and depressions reflecting the shape of the insulating layer 125.

Thus, the upper surface of the first electrode layer 103 has projections and depressions also in a region not overlapping with the auxiliary wiring 111; thus, the ratio of the diffusely-reflected light to the whole light emitted from the EL layer 105 can be increased. Accordingly, directional characteristics of light emitted from the light-emitting device 140 are reduced and the viewing angle dependence is improved.

For the insulating layer 125, for example, an organic resin such as polyimide, acrylic, polyamide, or epoxy or an inorganic insulating material such as a silicon oxide, a silicon nitride, a silicon oxynitride, or an aluminum oxide can be used. Although there is no limitation on a formation method, a coating method such as a spin-coating method or a dipping method, a sputtering method, an evaporation method, a droplet discharging method, a printing method such as a screen printing method or an offset printing method, a photolithography method, a nanoimprinting method, or the like can be used.

A drying agent may be contained in the insulating layer 125. For example, a substance which adsorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent.

This modification example describes a structure including the insulating layer 125 having projections and depressions in a lower layer than the first electrode layer 103; however, by using a conductive material for the insulating layer 125, a conductive layer on and in contact with the back surface of the first electrode layer 103 may be provided. In addition, the auxiliary wiring 121 in the above structure example may be provided in a region which does not overlap with the auxiliary wiring 111. When a conductive material is used instead of the insulating layer 125, voltage drop in the first electrode layer 103 is suppressed and luminance can be uniformly obtained.

In addition, a structure in which the upper surface (i.e., formation surface) of the first substrate 101 is processed to have projections and depressions and the insulating layer 125 is not formed may be used. As a method for directly processing the first substrate 101 to have projections and depressions, a photolithography method, a nanoimprinting method, a sandblasting method, or the like can be used as appropriate.

This embodiment can be combined with any of the other embodiments described in this specification as appropriate.

(Embodiment 3)

In this embodiment, as an example of the light-emitting device of one embodiment of the present invention, a structure example of a lighting device including a light-emitting element will be described with reference to drawings. Note that description of the same portions as those in the above embodiments is skipped or simplified.

Figure 6A:
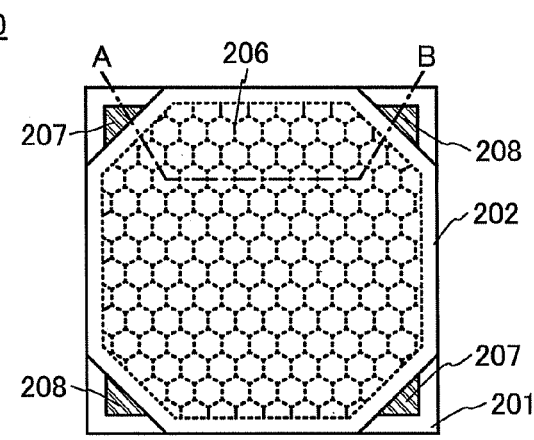
FIGS. 6A to 6C each illustrate a lighting device according to one embodiment of the present invention.
Figure 6B:
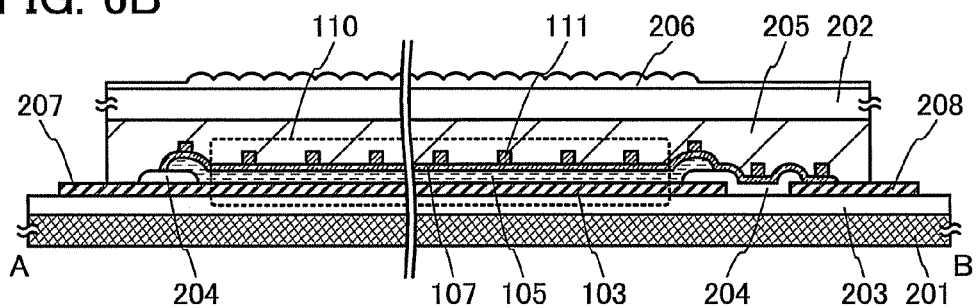

FIG. 6A is a schematic top view of a lighting device 200 exemplified in this embodiment. FIG. 6B is a schematic cross-sectional view taken along a cutting line A-B in FIG. 6A.

In the lighting device 200, a light-emitting element 110 provided over a first substrate 201 is sealed with a second substrate 202 which faces to a first substrate 201 and a sealing layer 205. On a region of the first substrate 201 which does not overlap with the second substrate 202, an extraction electrode 207 electrically connected to the first electrode layer 103 of the light-emitting element 110 and an extraction electrode 208 electrically connected to the second electrode layer 107 are provided. On the surface of the second substrate 202 which does not face to the light-emitting element 110, a lens array 206 is provided at least in a region overlapping with the light-emitting element 110.

An insulating layer 203 is provided on the upper surface of the first substrate 201. Over the insulating layer 203, the first electrode layer 103, the extraction electrode 207, and the extraction electrode 208 are provided. In addition, an insulating layer 204 covering part of the upper surface of the first electrode layer 103 and end portions of the first electrode layer 103 and the extraction electrode 208 is provided. Further, the EL layer 105 and the second electrode layer 107 are stacked in this order over the first electrode layer 103, so that the light-emitting element 110 is formed. Part of the second electrode layer 107 is electrically connected to the extraction electrode 208. In addition, the auxiliary wiring 111 is provided on and in contact with the upper surface of the second electrode layer 107. The sealing layer 205 is provided covering at least the light-emitting element 110. The first substrate 201 is bonded to the second substrate 202 with the sealing layer 205.

It is preferable that a substrate having high thermal conductivity be used as the first substrate 201. When each of the first substrate 201 and the second substrate 202 is a substrate thin enough to have flexibility, a flexible light-emitting device can be provided. For example, a 0.2-mm-thick aluminum substrate is used as the first substrate 201.

When a flexible substrate is used as the second substrate 202, a sheet-like organic resin, a thin glass flexible substrate, or the like can be used, for example.

A material in which a plurality of layers is stacked can be used for the second substrate 202. When a glass layer is used, a barrier property against water and oxygen can be improved and thus a reliable light-emitting device can be provided.

In particular, a sheet in which a glass layer, a bonding layer, and an organic resin layer are stacked from the side closer to the light-emitting element 110 is preferably used for the second substrate 202. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and a high flexibility. The thickness of the organic resin layer is greater than or equal to 10 μm and less than or equal to 200 μm, preferably greater than or equal to 20 μm and less than or equal to 50 μm. Providing such organic resin layer outside the glass layer, occurrence of a crack or a break in the glass layer can be suppressed and mechanical strength can be improved. Forming the second substrate 202 by such a composite material of a glass material and an organic resin, a flexible light-emitting device with extremely high reliability can be provided.

The insulating layer 203 is provided in order to form an insulating surface on the formation surface of the first substrate 201. In addition, the insulating layer 203 can be used as a barrier film for suppressing dispersion of impurities contained in the first substrate 201 to the light-emitting element 110. The insulating layer 203 can be formed using a material and a method similar to those of the insulating layer 125 in the above embodiments.

The insulating layer 204 is provided to cover the end portion of the first electrode layer 103 in order to avoid short circuit between the second electrode layer 107 and the first electrode layer 103. An upper end portion or a lower end portion of the insulating layer 204 preferably has a curved surface with a curvature radius of 0.2 μm to 3 μm in order to be adequately covered with the second electrode layer 107 formed over the insulating layer 204. As a material of the insulating layer 204, an organic compound such as a negative photosensitive resin or a positive photosensitive resin, or an inorganic compound such as a silicon oxide or a silicon oxynitride can be used.

FIG. 6B is an example in which the extraction electrode 207 and the extraction electrode 208 are formed on the same plane and are formed using the same material as the first electrode layer 103. Here, part of the first electrode layer 103 serves as the extraction electrode 207.

The second electrode layer 107 is provided to extend beyond the insulating layer 204 which covers each end portion of the first electrode layer 103 and the extraction electrode 208 so as to be in contact with and electrically connected to the extraction electrode 208.

Note that the extraction electrode 207 and the extraction electrode 208 may be formed using a conductive film different from the first electrode layer 103. For example, a conductive film thicker than the first electrode layer 103 may be provided on the lower side than the first electrode layer 103 (the first substrate 201 side) with the insulating layer provided therebetween. In this case, a copper-containing conductive film is preferably used because the conductivity can be increased. The first electrode layer 103 may be provided on and in contact with the upper surface of the extraction electrode 207.

For the sealing layer 205, a curable resin such as a thermosetting resin or a photocurable resin, or gel is preferably used. As a material used for the sealing layer, polyvinyl chloride (PVC), acrylic, polyimide, an epoxy resin, a silicone resin, polyvinyl butyral (PVB), ethylene vinyl acetate (EVA), or the like can be used.

A drying agent may be contained in the sealing layer 205. For example, a substance which adsorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent. Further, when granular drying agents are contained, light emitted from the light-emitting element 110 is diffusely reflected by the drying agents; thus, a light-emitting device with high reliability and improved viewing angle dependence can be provided.

Alternatively, without using the sealing layer 205, outer edges of the first substrate 201 and the second substrate 202 can be bonded using a sealing material, which is called a sealed hollow structure. However, it is preferable that a space between the light-emitting element 110 and the second substrate 202 be filled with the sealing layer 205; thus, refractive index can be adjusted and the light extraction efficiency can be improved.

The lens array 206 is provided to suppress total reflection of light emitted from the light-emitting element 110 at an interface between the second substrate 202 and the outside (air). As the lens array 206, a lens array formed of a high refractive index material, a microlens array, a light diffusion sheet, or the like can be used. Particularly when a microlens array is used, the light extraction efficiency can be efficiently improved and the viewing angle dependence can be also improved; thus, a lighting device with uniform light emission luminance can be provided.

In addition, when the lens array 206 is provided, a no-light-emitting region formed by the auxiliary wiring 111 might become highlighted depending on the viewing angles. However, even in such a case, an extremely thin wiring is used as the auxiliary wiring 111 and thus the no-light-emitting region is not perceivable as luminance defect.

In the structure of FIG. 6B, the lens array 206 is in contact with the second substrate 202; however, a structure in which the upper surface of the second substrate 202 is processed to have projections and depressions to suppress total reflection may be employed. Alternatively, the surface facing with the light-emitting element 110 of the second substrate 202 may be provided with a lens array or may have unevenness. As a method for directly processing the second substrate 202 to have projections and depressions, a photolithography method, a nanoimprinting method, a sandblasting method, or the like can be used as appropriate.

Here, it is preferable that the refractive index of the second substrate 202 be higher than that of the sealing layer 205 and the refractive index of the lens array be higher than that of the sealing layer 205. Alternatively, the refractive index of the second substrate 202 may be higher than that of the sealing layer 205 and the refractive index of the lens array may be higher than that of the second substrate 202. That is, refractive index gets higher as farther from the light-emitting element 110. With such a structure, total reflection does not occur at an interface between the sealing layer 205 and the second substrate 202 and an interface between the second substrate 202 and the lens array; thus, the light emitted from the light-emitting element 110 can be almost thoroughly extracted.

In the lighting device 200 shown in FIG. 6B, the auxiliary wiring 111 is provided on and in contact with the second electrode layer 107. Thus, the lighting device 200 in which voltage drop is suppressed and the light extraction efficiency is increased can be provided.

Figure 6C:
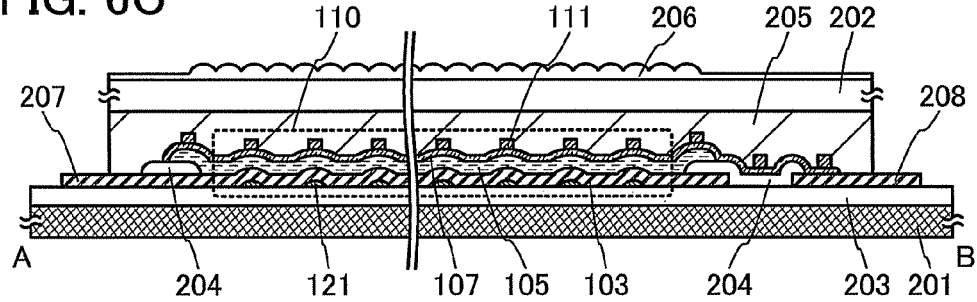

FIG. 6C shows a structure in which the auxiliary wiring 121 (second auxiliary wiring) exemplified in Embodiment 2 is provided. The auxiliary wiring 121 suppresses voltage drop in the first electrode layer 103, and at the same time, projections and depressions of the upper surface of the first electrode layer 103 in the region overlapping with the auxiliary wiring 111 provides high light extraction efficiency.

This embodiment can be combined with any of the other embodiments disclosed in this specification as appropriate.

(Embodiment 4)

In this embodiment, a structure example of a light-emitting element which can be applied to a light-emitting device according to one embodiment of the present invention will be described with reference to drawings.

The light-emitting element described in this embodiment as an example includes a first electrode, a second electrode, and a layer containing a light-emitting organic compound (hereinafter referred to as EL layer) provided between the first electrode and the second electrode. One of the first electrode and the second electrode serves as an anode, and the other serves as a cathode. The EL layer is provided between the first electrode and the second electrode, and a structure of the EL layer may be appropriately selected in accordance with materials of the first electrode and second electrode. An example of the structure of the light-emitting element will be described below; it is needless to say that the structure of the light-emitting element is not limited to this example.

<Structure Example 1 of Light-Emitting Element>

Figure 7A:
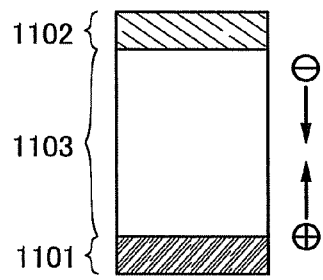
FIGS. 7A to 7E each illustrate a light-emitting element according to one embodiment of the present invention.

An example of the structure of the light-emitting element is illustrated in FIG. 7A. In the light-emitting element illustrated in FIG. 7A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, it can be said that Structure Example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 7B:
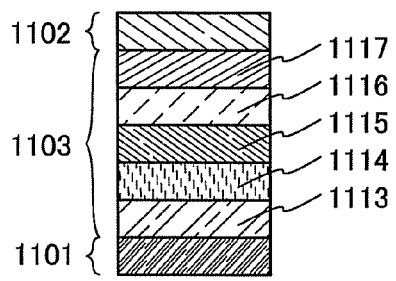

An example of a specific structure of the light-emitting unit 1103 is illustrated in FIG. 7B. In the light-emitting unit 1103 illustrated in FIG. 7B, a hole-injection layer 1113, a hole-transport layer 1114, a light-emitting layer 1115, an electron-transport layer 1116, and an electron-injection layer 1117 are stacked in that order from the anode 1101 side.

<Structure Example 2 of Light-Emitting Element>

Figure 7C:
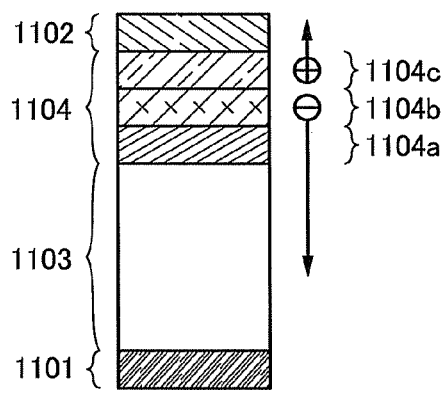

Another example of the structure of the light-emitting element is illustrated in FIG. 7C. In the light-emitting element illustrated in FIG. 7C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit included in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 may be formed to include at least a charge generation region, and may have a structure in which the charge generation region and a layer other than the charge generation region are stacked. For example, a structure can be employed in which a first charge generation region 1104*c*, an electron-relay layer 1104*b*, and an electron-injection buffer 1104*a* are stacked in that order from the cathode 1102 side.

The behaviors of electrons and holes in the intermediate layer 1104 are described. When a voltage higher than the threshold voltage of the light-emitting element is applied between the anode 1101 and the cathode 1102, in the first charge generation region 1104*c*, holes and electrons are generated, and the holes move into the cathode 1102 and the electrons move into the electron-relay layer 1104*b*. The electron-relay layer 1104*b* has a high electron-transport property and immediately transfers the electrons generated in the first charge generation region 1104*c* to the electron-injection buffer 1104*a*. The electron-injection buffer 1104*a* can reduce a barrier against electron injection into the light-emitting unit 1103, so that the efficiency of the electron injection into the light-emitting unit 1103 can be improved. Thus, the electrons generated in the first charge generation region 1104*c* are injected into the LUMO level of the light-emitting unit 1103 through the electron-relay layer 1104*b* and the electron-injection buffer 1104*a*.

In addition, the electron-relay layer 1104*b* can prevent interaction in which the substance included in the first charge generation region 1104*c* and the substance included in the electron-injection buffer 1104*a* react with each other at the interface thereof and the functions of the first charge generation region 1104*c* and the electron-injection buffer 1104*a* are damaged.

The range of choices of materials that can be used for the cathode in Structure Example 2 of the light-emitting element is wider than that of materials that can be used for the cathode in Structure Example 1 of the light-emitting element. This is because a material having a relatively high work function can be used for the cathode in Structure Example 2 as long as the cathode in Structure Example 2 receives at least holes generated by the intermediate layer.

<Structure Example 3 of Light-Emitting Element>

Figure 7D:
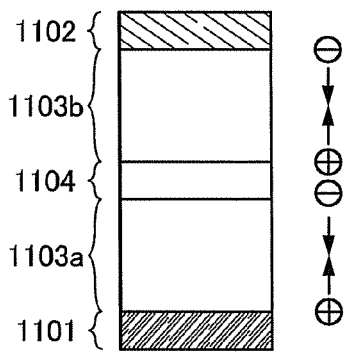

Another example of the structure of a light-emitting element is illustrated in FIG. 7D. In the light-emitting element illustrated in FIG. 7D, an EL layer including two light-emitting units is provided between the anode 1101 and the cathode 1102. Furthermore, the intermediate layer 1104 is provided between a first light-emitting unit 1103a and a second light-emitting unit 1103b.

Figure 7E:
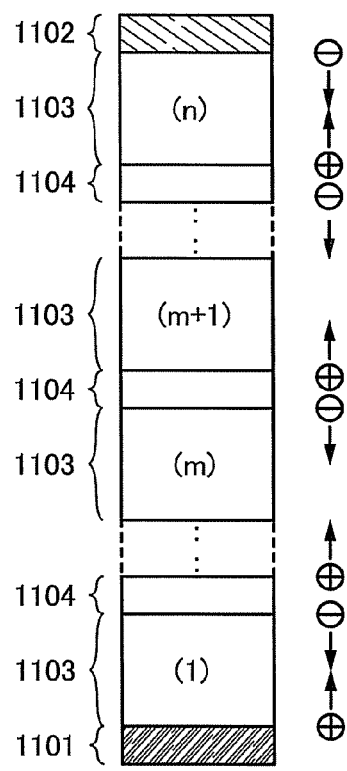

Note that the number of the light-emitting units provided between the anode and the cathode is not limited to two. A light-emitting element illustrated in FIG. 7E has a structure in which a plurality of light-emitting units 1103 are stacked, that is, a so-called tandem structure. Note that in the case where n (n is a natural number greater than or equal to 2) light-emitting units 1103 are provided between the anode and the cathode, the intermediate layer 1104 is provided between an m-th (m is a natural number greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Thus, for the details, the description of the structure example 1 of the light-emitting element or the structure example 2 of the light-emitting element can be referred to.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

The structure examples 1 to 3 of the light-emitting element can be implemented in combination. For example, an intermediate layer may be provided between the cathode and the light-emitting unit in Structure Example 3 of the light-emitting element.

Further, a plurality of light-emitting substances which emit light of different colors can be used, whereby, for example, white light emission can also be obtained by expanding the width of the emission spectrum. In order to obtain white light emission, for example, a structure may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

This embodiment can be combined with any of the other embodiments disclosed in this specification as appropriate.

(Embodiment 5)

In this embodiment, examples of a lighting device using the light-emitting device of one embodiment of the present invention are described with reference to drawings.

The light-emitting device of one embodiment of the present invention can be a lighting device having a curved light-emitting surface by using a flexible substrate. Thus, the light-emitting device can be incorporated along a curved inside/outside wall surface of a house or a building or a curved interior/exterior surface of a car.

Figure 8A:
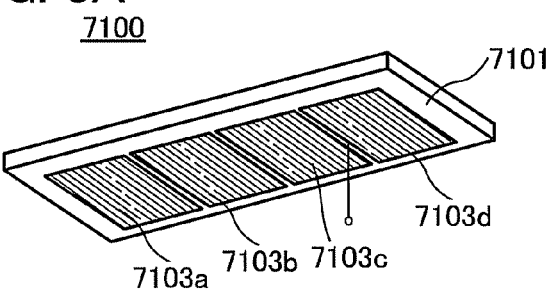
FIGS. 8A to 8D each illustrate a lighting device according to one embodiment of the present invention.

FIG. 8A illustrates an example of a lighting device. In a lighting device 7100, light-emitting devices 7103a to 7103d of one embodiment of the present invention are incorporated in a housing 7101 as light sources. The lighting device 7100 can be attached to a ceiling, a wall, or the like.

Further, the light-emitting device includes a light-emitting panel which emits light having high brightness and a pale color and causing less eyestrain even in the case of long-time use, light of a bright red color, and light of a bright color different from the other colors. By adjusting conditions under which the light-emitting element is driven for each emission color, a lighting device whose hue can be adjusted by a user can be achieved.

Figure 8B:
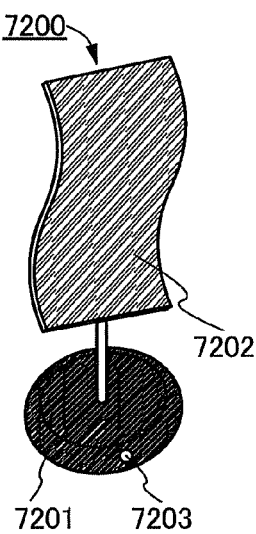
Figure 8C:
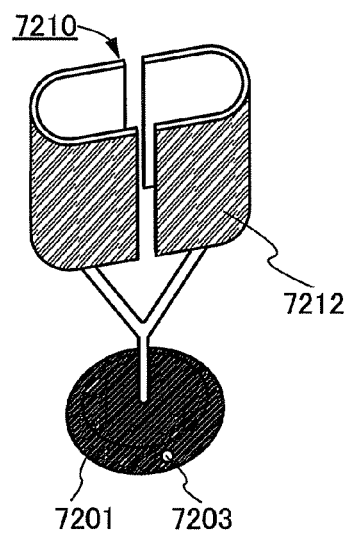
Figure 8D:
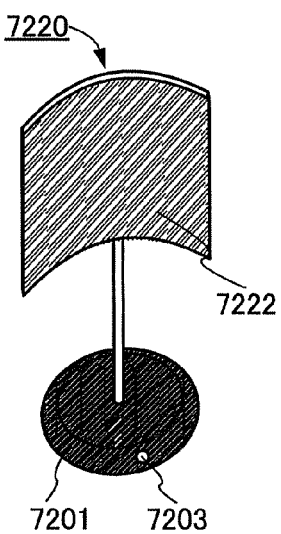

FIGS. 8B to 8D each illustrate an example of a lighting device. Lighting devices 7200, 7210, and 7220 each include a stage 7201 provided with an operation switch 7203 and a light-emitting portion supported by the stage 7201.

The lighting device 7200 in FIG. 8B includes a light-emitting portion 7202 having a wave-shaped light-emitting surface, which is good-design lighting device.

A light-emitting portion 7212 included in the lighting device 7210 illustrated in FIG. 8C has two convex-curved light-emitting portions symmetrically placed. Thus, all directions can be illuminated with the lighting device 7210 as a center.

The lighting device 7220 illustrated in FIG. 8D includes a depressed curved light-emitting portion 7222. This is suitable for illuminating a specific range because light emitted from the light-emitting portion 7222 is collected to the front of the lighting device 7220.

Here, the light-emitting portion 7222 includes the light-emitting device of one embodiment of the present invention. Thus, the lighting device is reliable in which voltage drop is suppressed and the light extraction efficiency is increased.

Needless to say, there is no particular limitation to the above-described lighting device as long as the light-emitting device of one embodiment of the present invention is included.

This embodiment can be combined with any of the other embodiments and example described in this specification as appropriate.

This application is based on Japanese Patent Application serial No. 2012-060106 filed with Japan Patent Office on Mar. 16, 2012, the entire contents of which are hereby incorporated by reference.

What is claimed is:

1. A method for manufacturing a light-emitting device, comprising the steps of:
    forming a first auxiliary wiring over an insulating surface;
    forming a first electrode layer over and in contact with the first auxiliary wiring;
    forming a layer containing a light-emitting organic compound over the first electrode layer;
    forming a second electrode layer over the layer;
    forming a second auxiliary wiring over and in contact with the second electrode layer; and
    forming a graphene film over the second electrode layer and the second auxiliary wiring,
    wherein the first electrode layer has a reflective property with respect to light emitted from the layer,
    wherein the second electrode layer has a light-transmitting property with respect to light emitted from the layer,
    wherein the first auxiliary wiring overlaps the second auxiliary wiring, and
    wherein a thickness of the second electrode layer is from 3 nm to 50 nm.

2. The method according to claim 1, wherein a width of the second auxiliary wiring is from 10 nm to 100 μm at thinnest, when seen from a direction perpendicular to the insulating surface.

3. The method according to claim 1, wherein a width of the second auxiliary wiring is from 10 nm to 1 μm at thinnest, when seen from a direction perpendicular to the insulating surface.

4. The method according to claim 1, wherein the second electrode layer includes a layer formed of a metal or an alloy.

5. The method according to claim 1,
    wherein the second auxiliary wiring is arrayed in a two-dimensional pattern when seen from a direction perpendicular to the insulating surface, and
    wherein a shape surrounded by the second auxiliary wiring is circular or polygonal.

6. The method according to claim 1, wherein an upper surface of the first electrode layer has a projection and a depression.

7. The method according to claim 1, wherein the first electrode layer is provided over a substrate containing at least one of a metal and an alloy.

8. The method according to claim 1, further comprising the steps of:
    providing a substrate over the second electrode layer, the substrate having a light-transmitting property with respect to light emitted from the layer; and
    providing a lens array over and in contact with the substrate.

9. The method according to claim 1, further comprising the steps of:
    forming a sealing layer over the second electrode layer;
    providing a substrate over the sealing layer, the substrate having a light-transmitting property with respect to light emitted from the layer; and
    providing a lens array over and in contact with the substrate.

10. The method according to claim 9,
    wherein a refractive index of the substrate is higher than a refractive index of the sealing layer, and
    wherein a refractive index of the lens array is higher than the refractive index of the sealing layer.

11. A method for manufacturing a light-emitting device, comprising the steps of:
    forming a first auxiliary wiring over an insulating surface by a nanoimprinting method;
    forming a first electrode layer over and in contact with the first auxiliary wiring;
    forming a layer containing a light-emitting organic compound over the first electrode layer;
    forming a second electrode layer over the layer;
    forming a second auxiliary wiring over and in contact with the second electrode layer by a nanoimprinting method; and
    forming a graphene film over the second electrode layer and the second auxiliary wiring,
    wherein the first electrode layer has a reflective property with respect to light emitted from the layer,
    wherein the second electrode layer has a light-transmitting property with respect to light emitted from the layer,
    wherein the first auxiliary wiring overlaps the second auxiliary wiring, and
    wherein a thickness of the second electrode layer is from 3 nm to 50 nm 12. The method according to claim 11, wherein a width of the second auxiliary wiring is from 10 nm to 100 μm at thinnest, when seen from a direction perpendicular to the insulating surface.

13. The method according to claim 11, wherein a width of the second auxiliary wiring is from 10 nm to 1 μm at thinnest, when seen from a direction perpendicular to the insulating surface.

14. The method according to claim 11, wherein the second electrode layer includes a layer formed of a metal or an alloy.

15. The method according to claim 11,
    wherein the second auxiliary wiring is arrayed in a two-dimensional pattern when seen from a direction perpendicular to the insulating surface, and
    wherein a shape surrounded by the second auxiliary wiring is circular or polygonal.

16. The method according to claim 11, wherein an upper surface of the first electrode layer has a projection and a depression.

17. The method according to claim 11, wherein the first electrode layer is provided over a substrate containing at least one of a metal and an alloy.

18. The method according to claim 11, further comprising the steps of:
    providing a substrate over the second electrode layer, the substrate having a light-transmitting property with respect to light emitted from the layer; and
    providing a lens array over and in contact with the substrate.

19. The method according to claim 11, further comprising the steps of:
    forming a sealing layer over the second electrode layer;
    providing a substrate over the sealing layer, the substrate having a light-transmitting property with respect to light emitted from the layer; and
    providing a lens array over and in contact with the substrate.

20. The method according to claim 19,
    wherein a refractive index of the substrate is higher than a refractive index of the sealing layer, and
    wherein a refractive index of the lens array is higher than the refractive index of the sealing layer.

* * * * *